United States Patent
Wang et al.

(10) Patent No.: US 7,362,141 B2
(45) Date of Patent: Apr. 22, 2008

(54) LOGIC DEVICE WITH LOW EMI

(75) Inventors: Yao-Chi Wang, Hsinchu (TW);
Ying-Tang Chang, Sindian (TW);
Ching-Wen Pan, Kaohsiung (TW);
Chin-Pin Yu, Longtan Shiang (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 46 days.

(21) Appl. No.: 11/407,941

(22) Filed: Apr. 21, 2006

(65) Prior Publication Data
US 2006/0244477 A1  Nov. 2, 2006

(30) Foreign Application Priority Data
Apr. 28, 2005  (TW) ............................ 94113578 A

(51) Int. Cl.
*H03F 3/45* (2006.01)
(52) U.S. Cl. .............................. 327/53; 326/26; 326/83; 327/309; 327/320; 327/321
(58) Field of Classification Search ................ 326/21, 326/26, 81–83, 86–87; 327/53, 66, 108, 327/132
See application file for complete search history.

(56) References Cited

U.S. PATENT DOCUMENTS

| | | | | |
|---|---|---|---|---|
| 5,491,437 A | * | 2/1996 | Rincon et al. | 327/108 |
| 6,064,230 A | * | 5/2000 | Singh | 326/83 |
| 6,573,752 B1 | * | 6/2003 | Killat | 326/83 |

* cited by examiner

*Primary Examiner*—Vibol Tan
*Assistant Examiner*—Christopher Lo
(74) *Attorney, Agent, or Firm*—Bacon & Thomas, PLLC

(57) ABSTRACT

A logic device with low electromagnetic interference. The logic device includes a digital logic gate, a voltage-limited circuit and a current-limited circuit. The digital logic gate provides a corresponding digital logic function. The voltage-limited circuit is connected to the digital logic gate in order to provide a fixed voltage to the digital logic gate to thus reduce an output voltage swing of the digital logic gate. The current-limited circuit is connected to the digital logic gate in order to provide a fixed current to the digital logic gate to thus reduce a transient current of the digital logic gate. Accordingly, an electromagnetic interface (EMI) caused by switching of the digital logic gate is reduced with the reduced output voltage swing and transient current.

15 Claims, 7 Drawing Sheets

LOGIC DEVICE WITH LOW EMI

BACKGROUND OF THE INVENTION

1. Field of the Invention

The invention relates to a digital logic gate and, more particularly, to a logic device with low electromagnetic interference (EMI).

2. Description of Related Art

Due to increasingly powerful functions of current electronic products, the associated circuitry is becoming more and more complicated. For a good electronic product, in addition to the inherent functions, an electromagnetic interference (EMI) has a key impact on the product quality and technical capability indication. Therefore, the EMI causes an essential problem in the design of electronic products. A circuit designer uses an advanced CAD tool to widen the capability of work in the design of electronic circuits, but to give the little help with the EMI problem.

A typical technology uses long channel of PMOS or NMOS transistors to reduce the transient current in a logic gate to thus reduce the EMI problem in the logic gate. However, such a long channel of transistor technology increases the cost due to the increased area required for the logic gate, which is caused by the increased channel length. In addition, when the process is changed, re-adjusting the channel length of a transistor is required, so as to increase the processing complexity. Another typical technology uses current-limited resistors to reduce the transient current of a logic gate. As shown in FIG. 1, one resistor 110 is added between the source of the PMOS transistor 120 and a high potential Vdd, and the other resistor 140 is added between the source of the NMOS transistor 130 and the ground.

In this case, the current-limited resistors 110, 140 can reduce the transient current. However, such a way can reduce the EMI in the logic gate but the area required for the logic gate is relatively increased. Therefore, it is desirable to provide an improved logic device to mitigate and/or obviate the aforementioned problems.

SUMMARY OF THE INVENTION

The object of the invention is to provide a logic device with low electromagnetic interference (EMI), which can overcome the prior EMI without increasing the required area of a logic gate in the prior art.

In accordance with one aspect of the present invention, there is provided a logic device with low electromagnetic interference (EMI). The logic device includes a digital logic gate and a current-limited circuit. The digital logic gate provides a corresponding digital logic function. The current-limited circuit is connected to the digital logic gate in order to provide a fixed current to the digital logic gate to thus reduce a transient current of the digital logic gate. Accordingly, an electromagnetic interface (EMI) caused by switching of the digital logic gate is reduced.

In accordance with another aspect of the present invention, there is provided a logic device with low electromagnetic interference (EMI). The logic device includes a current mirror circuit, a digital logic gate, a voltage-limited circuit and a current-limited circuit. The current mirror circuit is connected to a high potential and provides a fixed current through a node A. The digital logic gate provides a corresponding digital logic function. The voltage-limited circuit is connected to the current mirror circuit and the digital logic gate through the node A, and limits the voltage of node A to a fixed voltage in order to provide the fixed voltage to the digital logic gate to thereby reduce an output voltage swing of the digital logic gate. The current-limited circuit is connected to the current mirror circuit and the digital logic gate via the node A in order to provide a fixed current to the digital logic gate to thus reduce a transient current of the digital logic gate. Accordingly, an electromagnetic interface (EMI) caused by switching of the digital logic gate is reduced with the reduced output voltage swing and transient current.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
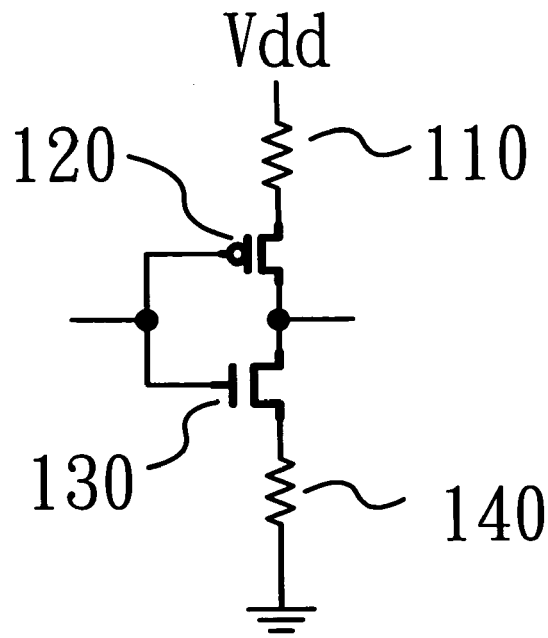
FIG. 1 is a schematic diagram of using conventional current-limited resistors to reduce a transient current.
Figure 2:
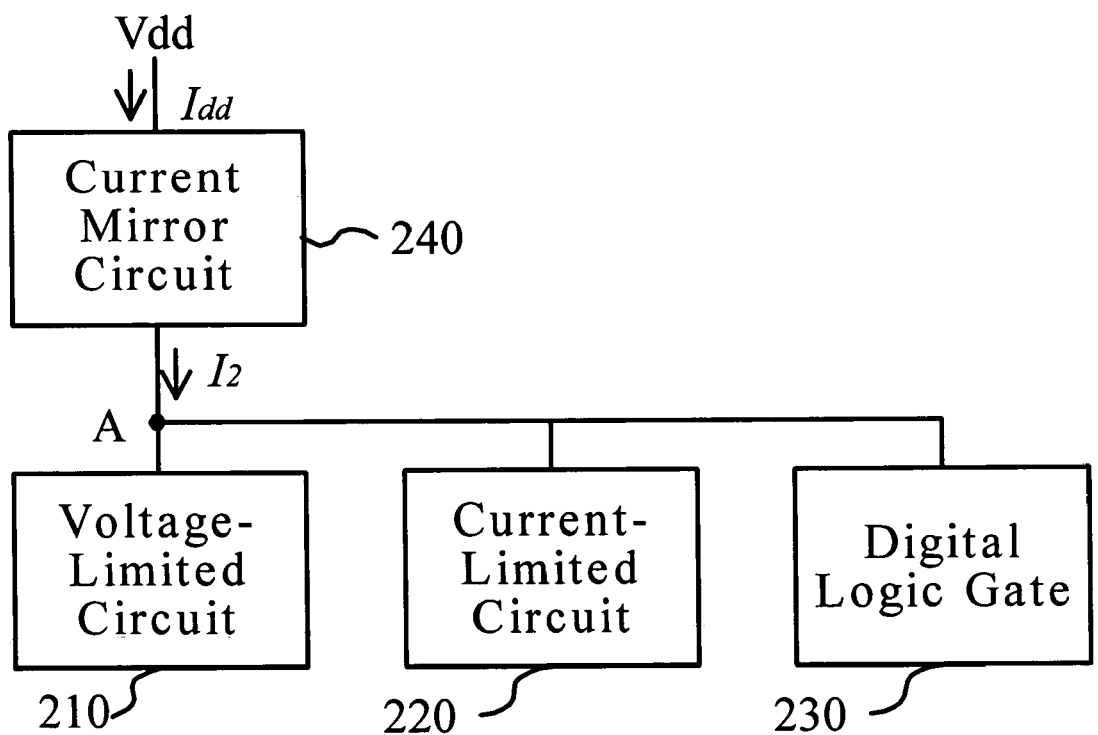
FIG. 2 is a block diagram of a logic device with low EMI in accordance with the invention.

FIG. 2 is a block diagram of a logic device with low EMI in accordance with the invention. As shown in FIG. 2, the logic device includes a current mirror circuit 240, a digital logic gate 230, a voltage-limited circuit 210 and a current-limited circuit 220. The current mirror circuit 240 is connected to a high potential Vdd. Thus, an input current $I_{dd}$ is inputted to the current mirror circuit 240, and a fixed current $I_2$ is output to a node A by the current mirror circuit 240.

The digital logic gate 230 provides a corresponding digital logic function. The digital logic gate 230 can be a NOT gate 231, a NAND gate 232, a NOR gate 233, or a combination cited above.

The voltage-limited circuit 210 is connected to the current mirror circuit 240 and the digital logic gate 230 through the node A in order to provide a fixed voltage to the digital logic gate 230 to thus reduce an output voltage swing of the digital logic gate 230. Accordingly, an electromagnetic interference (EMI) caused by switching of the digital logic gate 230 is reduced.

The current-limited current 220 is connected to the current mirror circuit 240 and the digital logic gate 230 through the node A in order to provide a fixed current to the digital logic gate 230 to thus reduce a transient current of the digital logic gate 230. Accordingly, an electromagnetic interface (EMI) caused by switching of the digital logic gate 230 is reduced.

Figure 3:
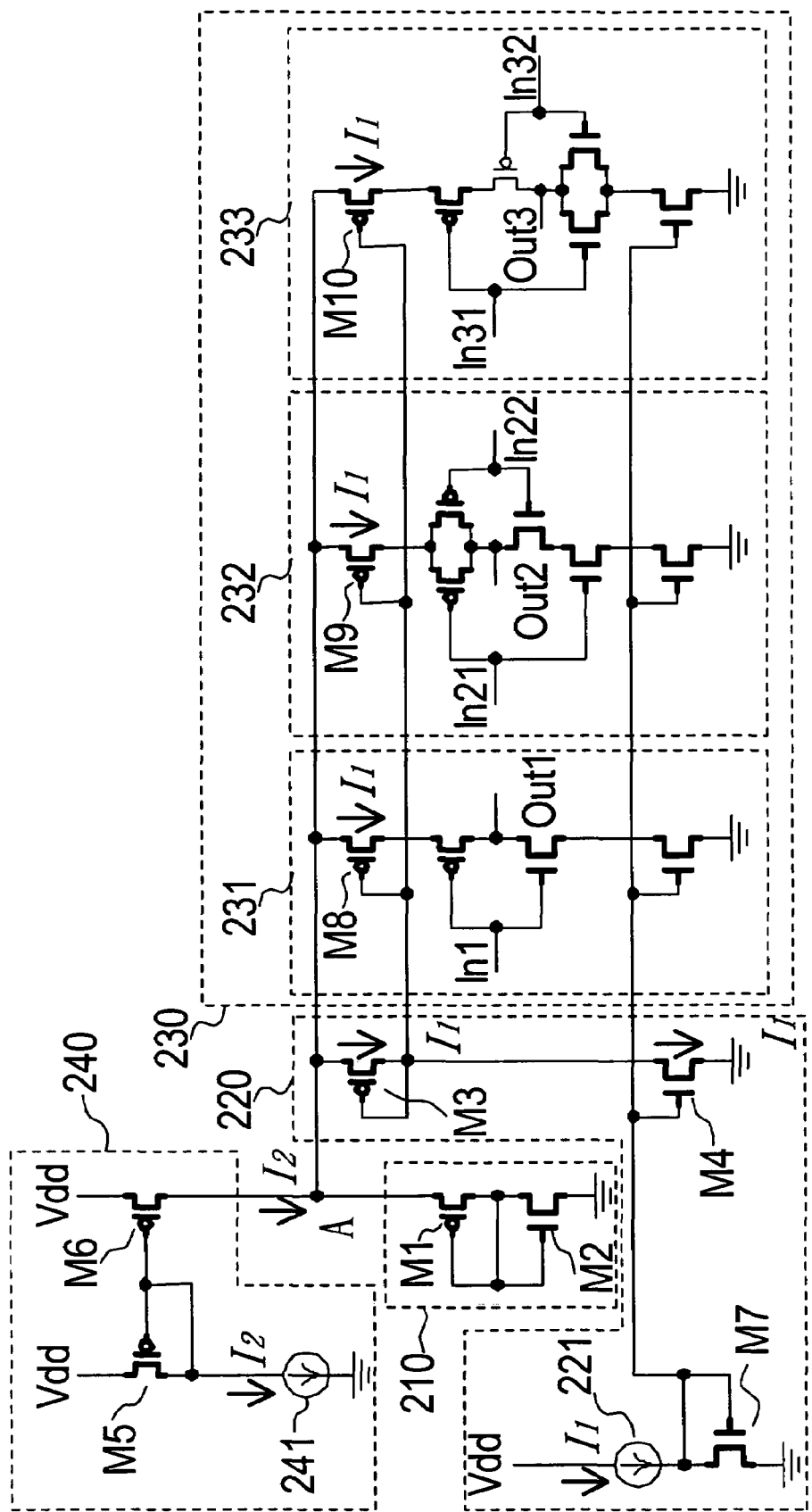
FIG. 3 is a circuit of the logic device of FIG. 2 in accordance with the invention.

FIG. 3 is an internal circuit of the logic device of FIG. 2 in accordance with the invention. As shown in FIG. 3, the current mirror circuit 240 has PMOS transistors M5, M6 and a current source 241. The transistor M5 has a source connected to a high potential Vdd, and a gate connected to a drain of the transistor M5, a gate of the transistor M6 and a positive terminal of the current source 241. The other terminal of the current source 241 is connected to ground. The transistor M6 has a source connected to the high potential Vdd, and a drain connected to the node A to thereby provide a fixed current $I_2$ through the node A. The high potential Vdd can be 5.0V, 3.3V or 2.5V.

Figure 4:
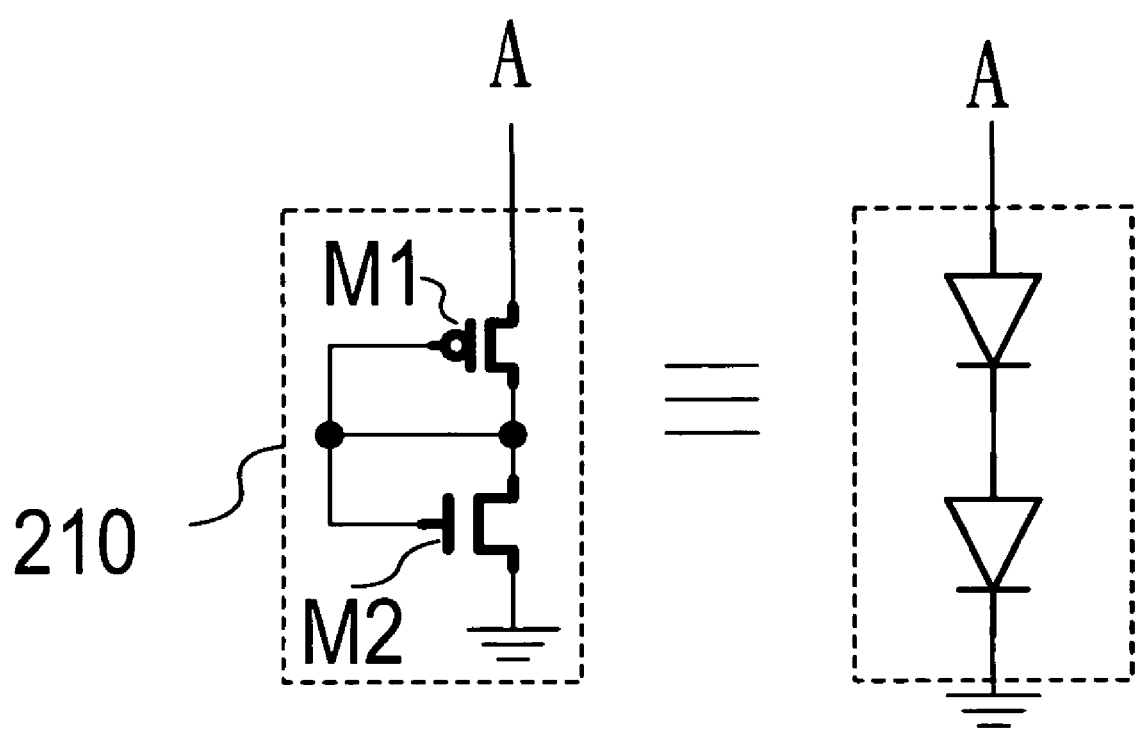
FIG. 4 is an equivalent circuit of a voltage-limited circuit in accordance with the invention.

The voltage-limited circuit 210 has a PMOS transistor M1 and an NMOS transistor M2. The transistor M1 has a source connected to the node A. The gate of the transistor M1 is connected to a drain of the transistor M1, a gate of the transistor M2, and a drain of the transistor M2. The source of the transistor M2 is connected to ground. The transistors M1, M2 are formed by diode-connected. FIG. 4 is an equivalent diagram of the voltage-limited circuit 210 in accordance with the invention. As shown in FIG. 4, regardless of the value of the high potential Vdd, a voltage $V_A$ of the node A is $2V_D$, where $V_D$ is a cut-in voltage of a diode in the region of forward biased. Typically, $V_D$ is about 0.6V, so the voltage $V_A$ is 1.2V.

The voltage-limited circuit 210 provides a fixed voltage ($2V_D$) which is smaller than Vdd to the digital logic gate 230 through the node A, thereby reducing the output voltage swing of the digital logic gate 230 and further reducing the EMI caused by switching of the digital logic gate 230.

The current-limited circuit 220 has a PMOS transistor M3, NMOS transistors M4, M7, and a current source 221. The transistor M3 has a source connected to the node A and a gate connected to the drain of the transistor M3 and the drain of the transistor M4. The transistor M4 has a source connected to the ground, a gate connected to one terminal of the current source 221, the gate of transistor M7 and the drain of transistor M7. A source of the transistor M7 is connected to the ground. The other terminal of the current source 221 is connected to Vdd.

Because the transistors M7 and M4 have a same gate-source voltage $V_{GS}$, the current passing through the transistors M4 and M7 is identical, and also equals to the current $I_1$ of the current source 221. The transistors M3 and M4 are connected in series, so the current passing through the transistor M3 is the current $I_1$. The transistor M8 of the NOT gate 231, the transistor M9 of the NAND gate 232 and the transistor M10 of the NOR gate 233 have a gate-source voltage $V_{GS}$ equal to the voltage $V_{GS}$ of the transistor M3. Accordingly, the current, passing through the NOT gate 231, NAND gate 232 and NOR gate 233 respectively, equals to the current $I_1$. Thus, the current-limited circuit 220 can provide a fixed current ($I_1$) to the digital logic gate through the node A, thereby reducing the transient current of the digital logic gate 230 and further reducing the EMI caused by switching of the digital logic gate 230.

Figure 5A:
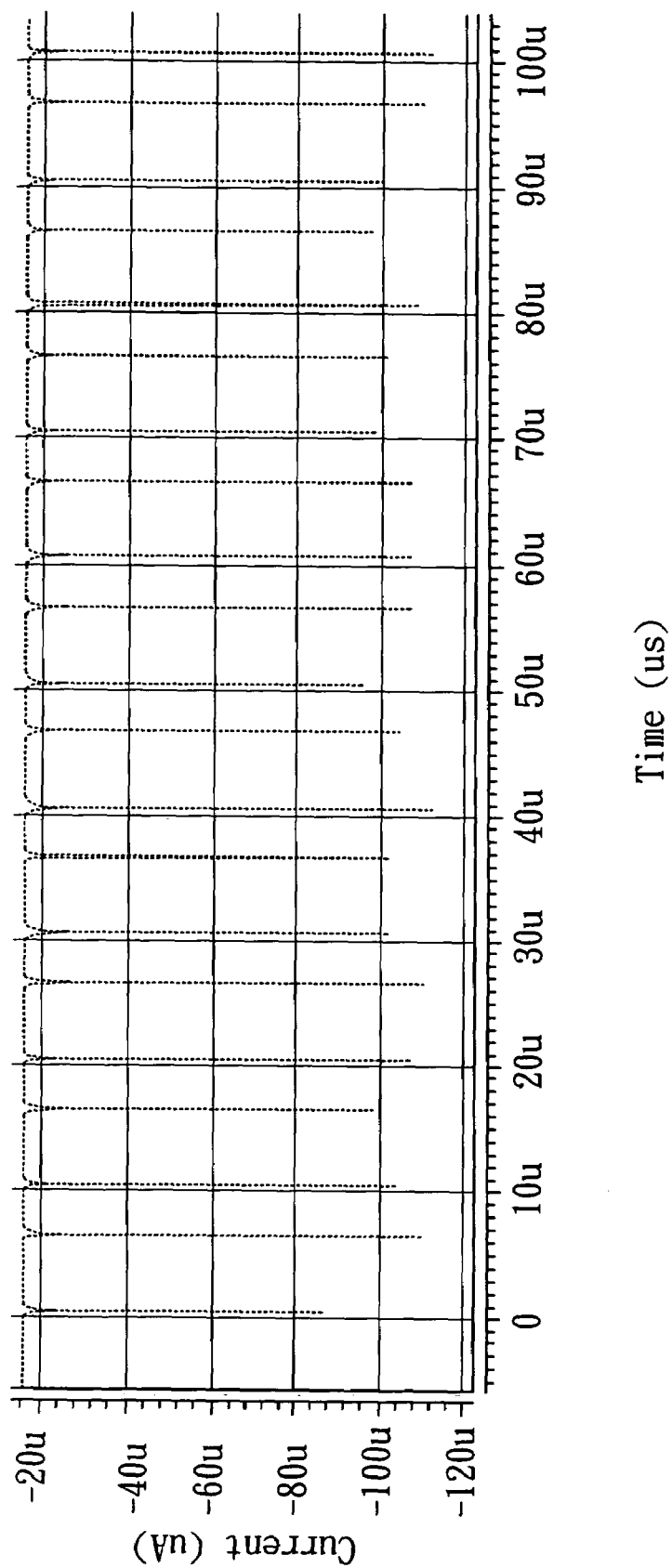
FIG. 5A is a schematic view of a simulation of peak currents $I_{dd}$ when a conventional digital logic gate is operated at 100 KHz.
Figure 5B:
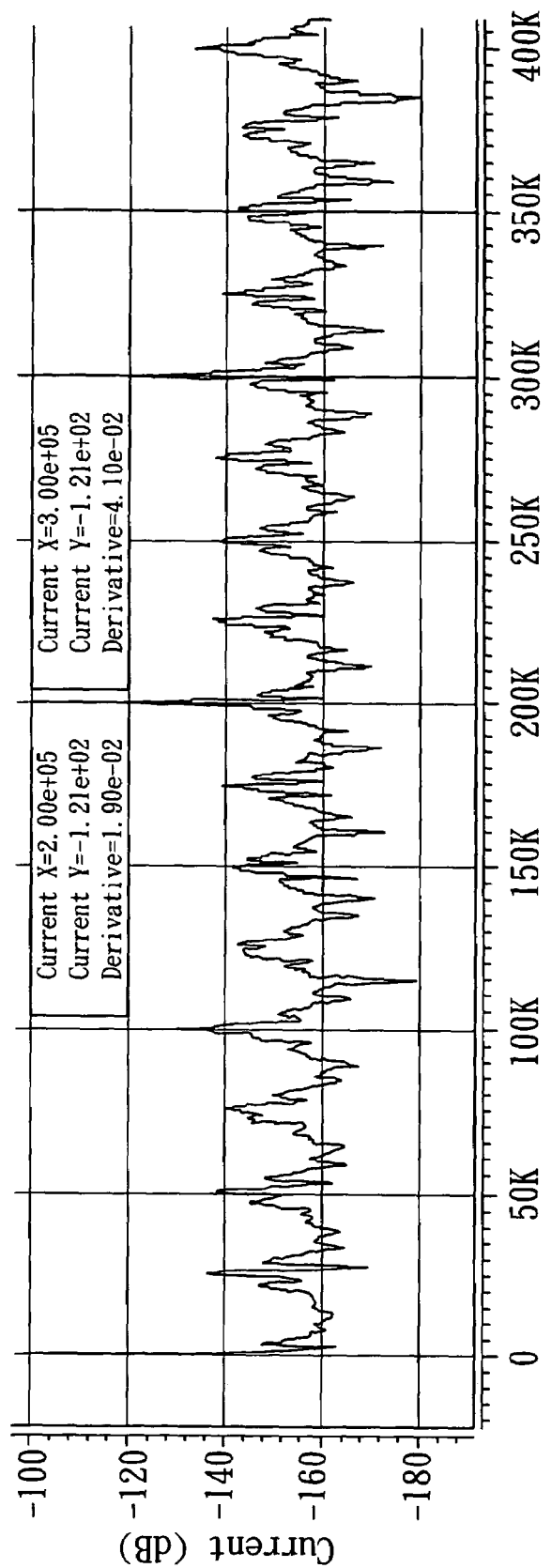
FIG. 5B is a schematic view of a spectrum of peak currents $I_{dd}$ generated when a digital logic gate is operated at 100 KHz.
Figure 6A:
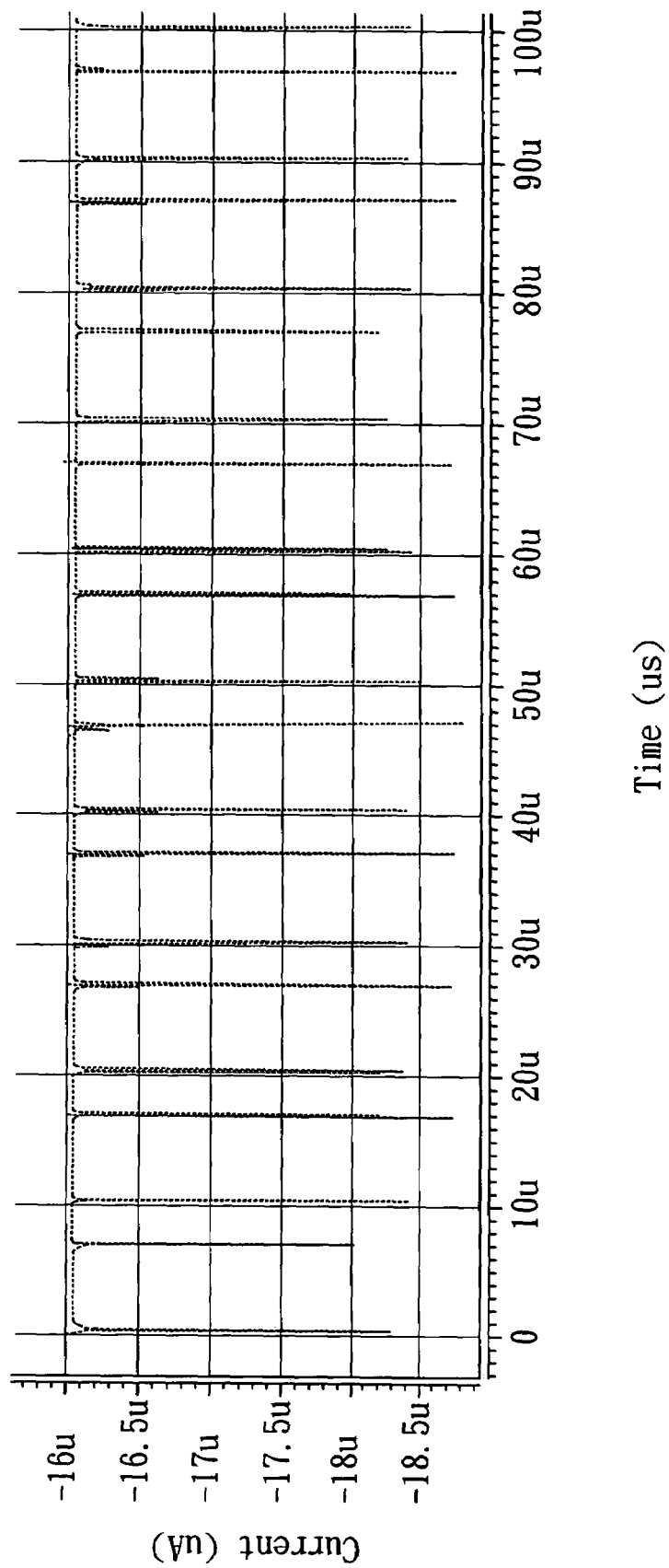
FIG. 6A is a schematic view of a simulation of peak currents $I_{dd}$ when a digital logic gate is operated at 100 KHz in accordance with the invention.
Figure 6B:
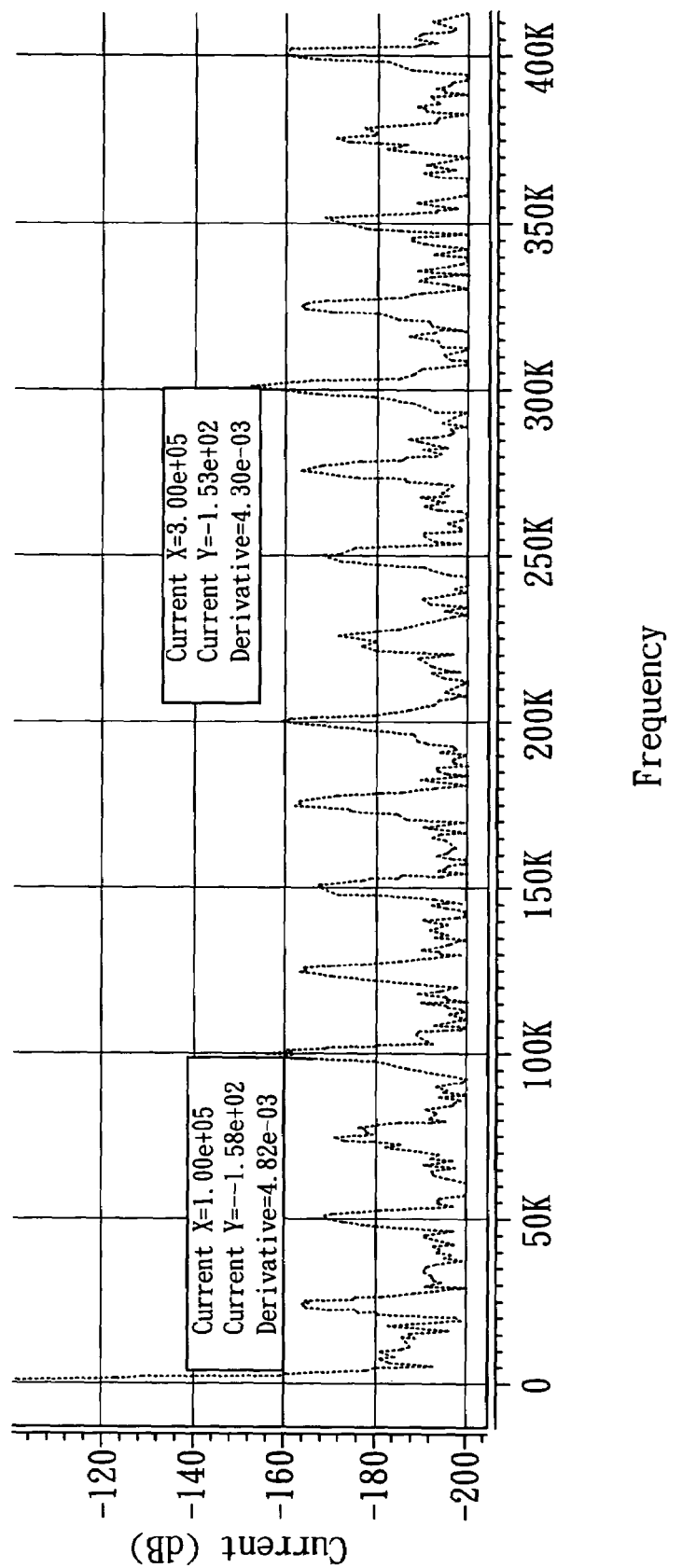
FIG. 6B is a schematic view of a spectrum of peak currents $I_{dd}$ generated when a digital logic gate is operated at 100 KHz in accordance with the invention.

FIG. 5A is a schematic view of a simulation of the input current $I_{dd}$ when a typical digital logic gate is operated at 100 KHz. FIG. 5B is a schematic view of a spectrum of the input current $I_{dd}$. As shown in FIGS. 5A and 5B, the current $I_{dd}$ consumed by the conventional digital logic gate is about 117 μA, and accordingly the EMI is about −121 dB. By contrast, FIG. 6A is a schematic view of a simulation of the input current $I_{dd}$ when the inventive digital logic gate is operated at 100 KHz in accordance with the invention, and FIG. 6B is a schematic view of a spectrum of the input current $I_{dd}$. As shown in FIGS. 6A and 6B, the current $I_{dd}$ consumed by the inventive digital logic gate is about 18.7 uA, and accordingly the EMI is about −153 dB. Therefore, the invention can improve the EMI by a 32 dB difference.

In view of the foregoing, it is known that the invention uses one or more diode-connected voltage drop as the high potential for the digital logic circuit in order to reduce the output voltage swing of the digital logic gate, thereby reducing the EMI caused by the digital logic gate.

Although the present invention has been explained in relation to its preferred embodiment, it is to be understood that many other possible modifications and variations can be made without departing from the spirit and scope of the invention as hereinafter claimed.

What is claimed is:

1. A logic device with low electromagnetic interference, comprising:
   a current mirror circuit, which is connected to a high potential and provides a first fixed current through a node;
   a digital logic gate, which provides a corresponding digital logic function;
   a voltage-limited circuit, which comprises a PMOS transistor and an NMOS transistor in a diode-connected form and is connected to the current mirror circuit and the digital logic gate via said node, and limits the voltage of node to a first fixed voltage in order to provide the first fixed voltage to the digital logic gate to thereby reduce an output voltage swing of the digital logic gate; and
   a current-limited circuit, which is connected to the current mirror circuit and the digital logic gate through the node in order to provide a second fixed current to the digital logic gate to thus reduce a transient current of the digital logic gate;
   wherein an electromagnetic interface (EMI) caused by switching of the digital logic gate is reduced by decreasing the output voltage swing and the transient current.

2. The device as claimed in claim 1, wherein the current-limited circuit is a current mirror.

3. The device as claimed in claim 1, wherein the digital logic gate is a NOT gate.

4. The device as claimed in claim 1, wherein the digital logic gate is a NAND gate.

5. The device as claimed in claim 1, wherein the digital logic gate is a NOR gate.

6. A logic device with low electromagnetic interference, comprising:
   a digital logic gate, which provides a corresponding digital logic function;
   a first transistor, which has a source connected to the digital logic gate through a node, and a gate connected to a drain of the first transistor;
   a second transistor, which has a source connected to a low voltage, and a gate connected to a drain of the second transistor and the gate of first transistor;
   a third transistor, which has a source connected to the digital logic gate through the node, and a gate connected to a drain of the third transistor;
   a fourth transistor, which has a source connected to the low voltage, and a drain connected to the drain of third transistor;
   a fifth transistor, which has a source connected to a high voltage, and a gate connected to a drain of the fifth transistor;

a sixth transistor, which has a source connected to the high voltage, and a gate connected to the gate of fifth transistor;

a seventh transistor, which has a drain connected to the gate of fourth transistor and a gate of the seventh transistor, and a source connected to the low voltage;

a first current source, which has one terminal connected to the high voltage, and the other terminal connected to the drain of the seventh transistor; and a second current source, which has one terminal connected to the low voltage, and the other terminal connected to the drain of fifth transistor.

7. The device as claimed in claim 6, wherein the digital logic gate is a NOT gate.

8. The device as claimed in claim 6, wherein the digital logic gate is a NAND gate.

9. The device as claimed in claim 6, wherein the digital logic gate is a NOR gate.

10. The device as claimed in claim 6, wherein the first transistor is a PMOS transistor and the second transistor is a NMOS transistor, and the first PMOS transistor and the second NMOS transistor are in a diode-connected.

11. The device as claimed in claim 6, wherein the third transistor is a PMOS transistor.

12. The device as claimed in claim 6, wherein the fourth transistor is a NMOS transistor.

13. The device as claimed in claim 6, wherein the fifth transistor is a PMOS transistor.

14. The device as claimed in claim 6, wherein the sixth transistor is a PMOS transistor.

15. The device as claimed in claim 6, wherein the seventh transistor is a NMOS transistor.

* * * * *